United States Patent
Xue et al.

(10) Patent No.: US 11,721,665 B2
(45) Date of Patent: Aug. 8, 2023

(54) WAFER LEVEL CHIP SCALE SEMICONDUCTOR PACKAGE

(71) Applicant: ALPHA AND OMEGA SEMICONDUCTOR INTERNATIONAL LP, Toronto (CA)

(72) Inventors: Yan Xun Xue, Los Gatos, CA (US); Madhur Bobde, Sunnyvale, CA (US); Long-Ching Wang, Cupertino, CA (US); Bo Chen, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 0 days.

(21) Appl. No.: 17/750,118

(22) Filed: May 20, 2022

(65) Prior Publication Data

US 2022/0278076 A1    Sep. 1, 2022

Related U.S. Application Data

(62) Division of application No. 17/137,811, filed on Dec. 30, 2020, now Pat. No. 11,430,762.

(51) Int. Cl.
*H01L 21/32* (2006.01)
*H01L 23/00* (2006.01)
*H01L 21/683* (2006.01)
*H01L 21/78* (2006.01)

(52) U.S. Cl.
CPC .......... *H01L 24/97* (2013.01); *H01L 21/6836* (2013.01); *H01L 21/78* (2013.01); *H01L 24/32* (2013.01); *H01L 2221/68327* (2013.01); *H01L 2221/68368* (2013.01); *H01L 2224/32245* (2013.01); *H01L 2224/95001* (2013.01)

(58) Field of Classification Search
CPC ..... H01L 24/97; H01L 21/6836; H01L 21/78; H01L 24/32; H01L 2221/68327; H01L 2221/68368; H01L 2224/32245; H01L 2224/95001
USPC .......................................................... 257/420
See application file for complete search history.

(56) References Cited

U.S. PATENT DOCUMENTS

| | | | |
|---|---|---|---|
| 7,906,842 B2 | 3/2011 | Park | |
| 7,985,661 B2 * | 7/2011 | Grivna | B23P 15/28 438/114 |
| 8,736,065 B2 * | 5/2014 | Gonzalez | H01L 24/82 257/777 |

(Continued)

FOREIGN PATENT DOCUMENTS

| CN | 107611095 A | 1/2018 |
|---|---|---|
| CN | 107845600 A | 3/2018 |

*Primary Examiner* — Vu A Vu
(74) *Attorney, Agent, or Firm* — Chen-Chi Lin

(57) ABSTRACT

A wafer level chip scale semiconductor package comprises a device semiconductor layer, a backside metallization layer, a film laminate layer, and a metal layer. The device semiconductor layer comprises a plurality of metal electrodes disposed on a front surface of the device semiconductor. Each side surface of the backside metallization layer is coplanar with a corresponding side surface of the device semiconductor layer. Each side surface of the metal layer is coplanar with a corresponding side surface of the film laminate layer. A surface area of a back surface of the backside metallization layer is smaller than a surface area of a front surface of the metal layer.

7 Claims, 9 Drawing Sheets

(56) References Cited

U.S. PATENT DOCUMENTS

| | | | |
|---|---|---|---|
| 9,159,693 B2* | 10/2015 | Choi | H01L 23/49833 |
| 9,224,679 B2 | 12/2015 | Xue | |
| 9,269,062 B2 | 2/2016 | Chen | |
| 9,508,648 B2* | 11/2016 | Kawase | H01L 24/32 |
| 9,935,082 B2* | 4/2018 | Watanabe | H01L 21/565 |
| 10,115,579 B2 | 10/2018 | Fan et al. | |
| 10,573,618 B1* | 2/2020 | Lin | H01L 24/19 |
| 10,779,413 B2* | 9/2020 | Schwarz | H01L 24/82 |
| 10,818,635 B2* | 10/2020 | Olson | H01L 24/05 |
| 11,004,828 B2* | 5/2021 | Wirz | H01L 24/95 |

* cited by examiner

WAFER LEVEL CHIP SCALE SEMICONDUCTOR PACKAGE

CROSS-REFERENCE TO RELATED APPLICATIONS

This Patent Application is a Divisional Application of a pending application Ser. No. 17/137,811 filed on Dec. 30, 2020. The Disclosure made in the patent application Ser. No. 17/137,811 is hereby incorporated by reference.

FIELD OF THE INVENTION

This invention relates generally to semi-wafer level packaging method. More particularly, the present invention relates to a semiconductor package manufacturing method comprising a dicing process separating device layer before attaching a metal supporting structure and a singulation process singulating the metal supporting structure.

BACKGROUND OF THE INVENTION

Traditional packaging method applies a single dicing process before a packaging process. Wafer-level chip-scale packaging (WLCSP) process of U.S. Pat. No. 9,087,828 to Yilmaz et al. applies a packing process before a single dicing process. When WLCSP process is applied to fabricate double-diffused metal-oxide-semiconductor field-effect transistor (DMOSFET) packages, a thinner device wafer is required to be attached a thicker backside metal so as to reduce resistance. Because of the mismatch of the coefficients of thermal expansion between the thinner device wafer and the thicker backside metal, warpage of the thinner device wafer may occur. The warpage of the thinner device wafer may initiate cracking and cause device failure.

It is advantageous to introduce the semi-wafer level packaging method of the present disclosure so as to reduce wafer warpage, to reduce resistance, and to increase device reliability performance. The semi-wafer level packaging method comprises a dicing process separating device layer before attaching a metal supporting structure and a singulation process singulating the metal supporting structure.

SUMMARY OF THE INVENTION

A semi-wafer level packaging method comprises the steps of providing a wafer; grinding a back side of the wafer; forming a metallization layer; removing a peripheral ring; bonding a first tape; applying a dicing process; bonding a second tape; removing the first tape; bonding a supporting structure; bonding a third tape; removing the second tape; and applying a singulation process.

A semi-wafer level packaging method comprises the steps of providing a wafer; attaching a carrier wafer to the wafer; grinding a back side of the wafer; forming a metallization layer; applying a dicing process; bonding a supporting structure; removing the carrier wafer; bonding a tape; and applying a singulation process.

DETAILED DESCRIPTION OF THE INVENTION

Figure 1:
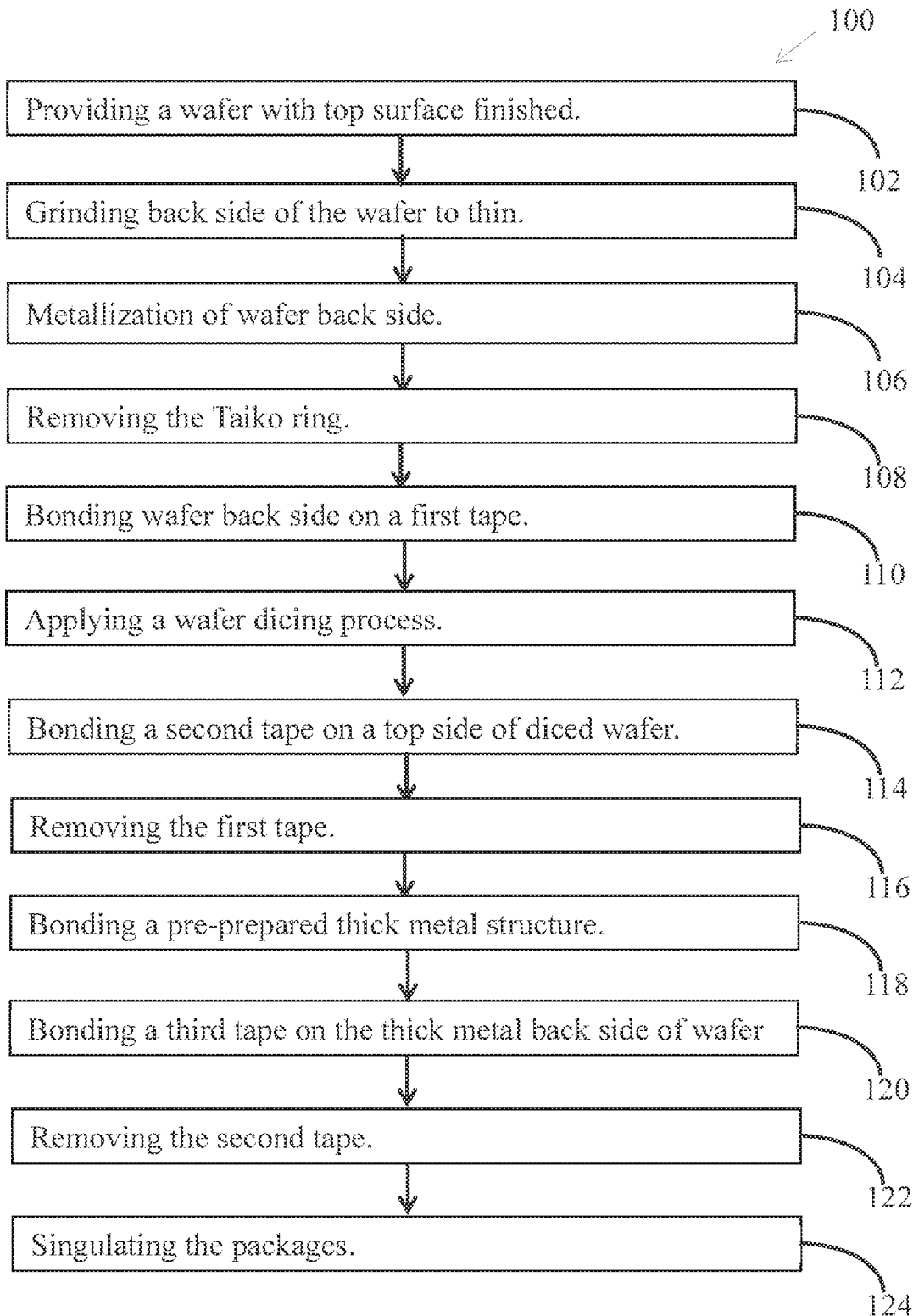
FIG. 1 is a flowchart of a process to develop a plurality of semiconductor packages in examples of the present disclosure.

FIG. 1 is a flowchart of a process 100 to develop a plurality of semiconductor packages in examples of the present disclosure. FIGS. 2A-2K show the cross sections of the corresponding steps. The process 100 may start from block 102.

Figure 2A:
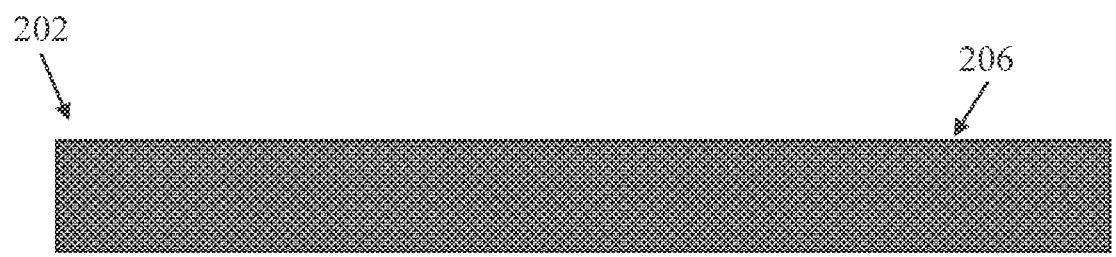
FIGS. 2A-2K show the cross sections of the corresponding steps of the process of FIG. 1 in examples of the present disclosure.

In block 102, referring now to FIG. 2A, a wafer 202 is provided. In one example, a top surface of the wafer 202 is finished with plurality of semiconductor devices formed thereon. The wafer 202 comprises a front side 204 and a back side 206 opposite the front side 204. Each semiconductor device includes a plurality of metal electrodes [not shown, metal electrodes are conventional features described in 37 CFR 1.83(a)] disposed on the front side 204. In one example, the wafer 202 is a silicon wafer. The wafer 202 may be a 4-inch, 6-inch, 8-inch, 12-inch, or 18-inch diameter wafer. Block 102 may be followed by block 104.

Figure 2B:
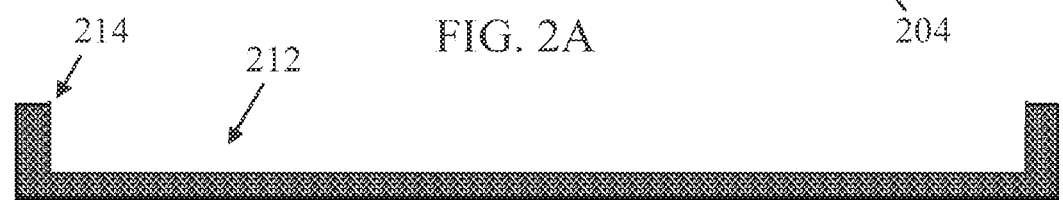

In block 104, referring now to FIG. 2B, a grinding process is applied to the back side 206 of the wafer 202 so as to thin the wafer 202 from its backside. In one example, the grinding process is only applied to a center portion of the back side 206 of the wafer 202 so as to form a recess 212 and a peripheral ring 214. The recess 212 is of a cylinder shape. The peripheral ring 214 is of a circular ring shape. The peripheral ring 214 may be a Taiko ring. Block 104 may be followed by block 106.

Figure 2C:
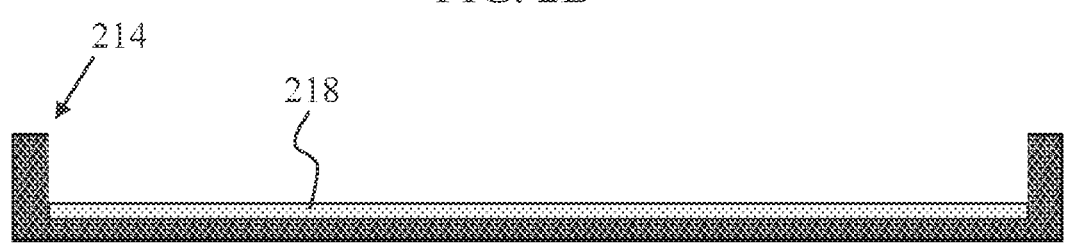

In block 106, referring now to FIG. 2C, a metallization layer 218 is formed in the recess 212. The metallization layer 218 is deposited to the back side of the wafer. In one example, the metallization layer 218 is made of copper. Block 106 may be followed by block 108.

Figure 2D:
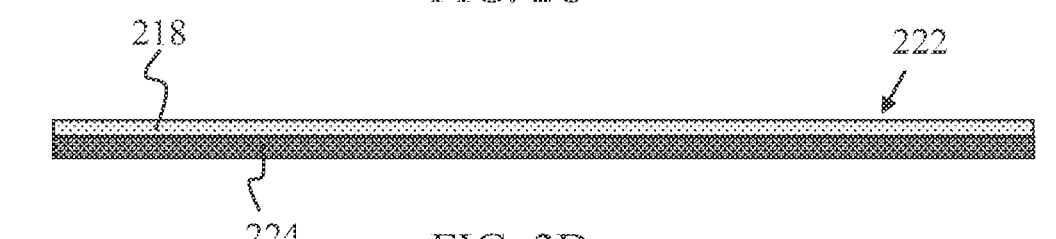

In block 108, referring now to FIG. 2D, the peripheral ring 214 (in one example, the Taiko ring) is removed so as to form a flat, circular, back surface 222. The metallization layer 218 covers an entire back surface of the thinned device layer 224. Block 108 may be followed by block 110.

Figure 2E:
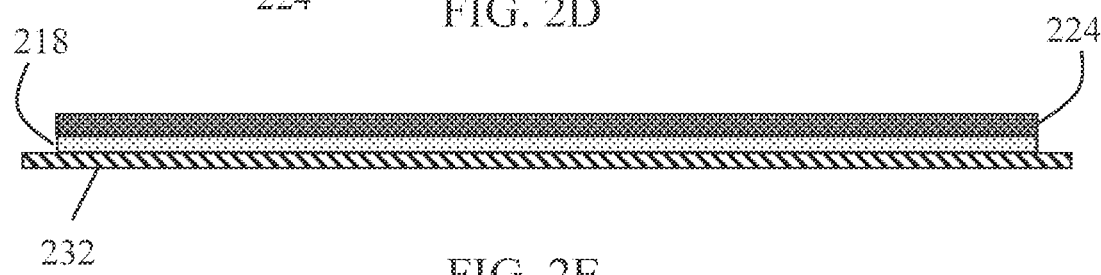

In block 110, referring now to FIG. 2E, the back side of the wafer is bonded to a first tape 232 by bonding the metallization layer 218 to the first tape 232. A diameter of the first tape 232 is larger than a diameter of the thinned device layer 224. Block 110 may be followed by block 112.

Figure 2F:
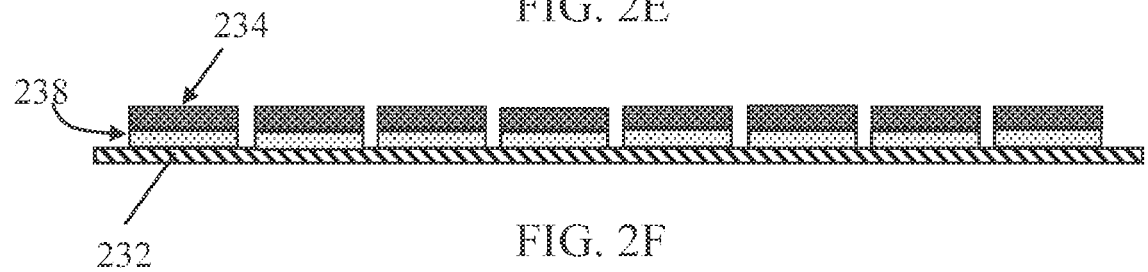

In block 112, referring now to FIG. 2F, a dicing process is applied. A plurality of diced device sections 234 and a plurality of diced metallization sections 238 are formed. In one example, a cut of the dicing process from the front side stops at a top surface of the first tape 232. In another example, a cut of the dicing process cuts into the first tape 232 with a cutting depth in a range from 5% to 15% of a thickness of the first tape 232. The first tape 232 holds the separated devices on their positions to maintain the wafer shape. Block 112 may be followed by block 114.

Figure 2G:
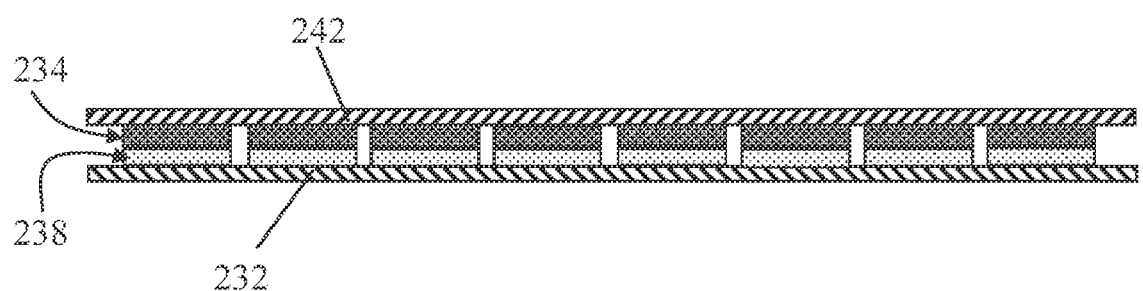

In block 114, referring now to FIG. 2G, the plurality of diced device sections 234 are attached to a second tape 242. The top side of the diced wafer is attached to the second tape 242. A diameter of the second tape 242 is larger than a diameter of the thinned device layer 224. Block 114 may be followed by block 116.

Figure 2H:
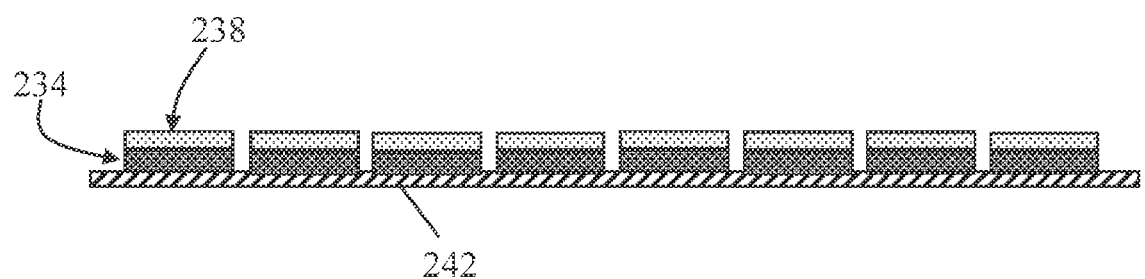

In block 116, referring now to FIG. 2H, the first tape 232 is removed. The second tape 242 holds the separated devices on their positions to maintain the wafer shape. Block 116 may be followed by block 118.

Figure 2I:
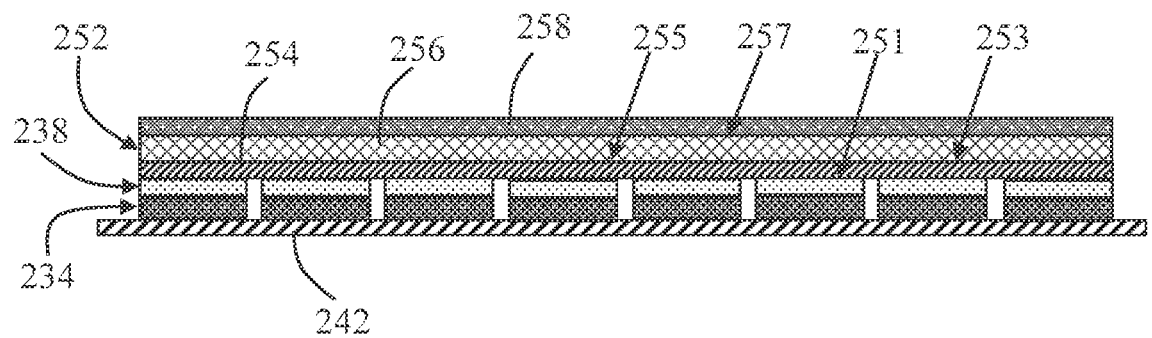

In block 118, referring now to FIG. 2I, a supporting structure 252 is attached to the plurality of diced metallization sections 238. In examples of the present disclosure, the supporting structure 252 is also referred to as a thick metal structure containing a thick metal layer of a pre-determined thickness. In one example, the supporting structure 252 comprises a film laminate 254 and a metal layer 256. In another example, the supporting structure 252 comprises a film laminate 254, a metal layer 256, and a marking film coating 258. The metal layer 256 comprises a first surface 257 and a second surface 255 opposite the first surface 257. The film laminate 254 comprises a first surface 253 and a second surface 251 opposite the first surface 253. The first surface 253 of the film laminate 254 is attached to the second surface 255 of the metal layer 256. The second surface 251 of the film laminate 254 is attached to the plurality of diced metallization sections 238. In one example, the film laminate 254 is a sintering Ag film. In another example, the film laminate is a conductive die attach film (CDAF).

Figure 3:
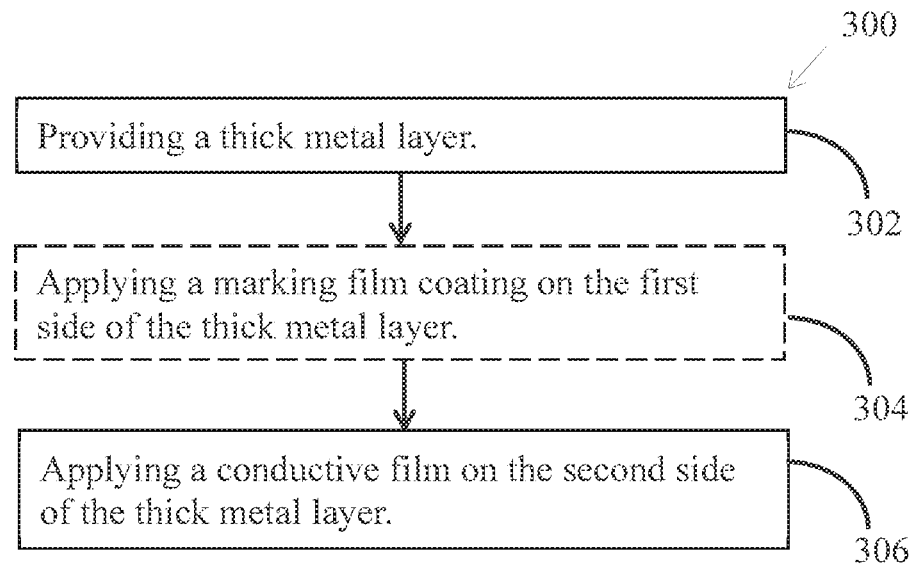
FIG. 3 is a flowchart of a process to develop a supporting structure in examples of the present disclosure.

FIG. 3 is a flowchart of a process 300 to develop a supporting structure 252 of FIG. 2I in examples of the present disclosure. The process 300 may start from block 302.

Figure 4A:
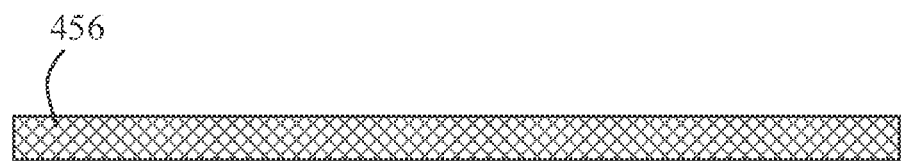
FIGS. 4A-4C show the cross sections of the corresponding steps of the process of FIG. 3 in examples of the present disclosure.

In block 302, referring now to FIG. 4A, a metal layer 456 is provided. In examples of the present disclosure, the metal layer 456 is also referred to as a thick metal layer. In one example, the metal layer 456 is made of copper. A thickness of the metal layer 456 is in a range from 10 microns to 100 microns. Block 302 may be followed by block 304 or block 306.

Figure 4B:
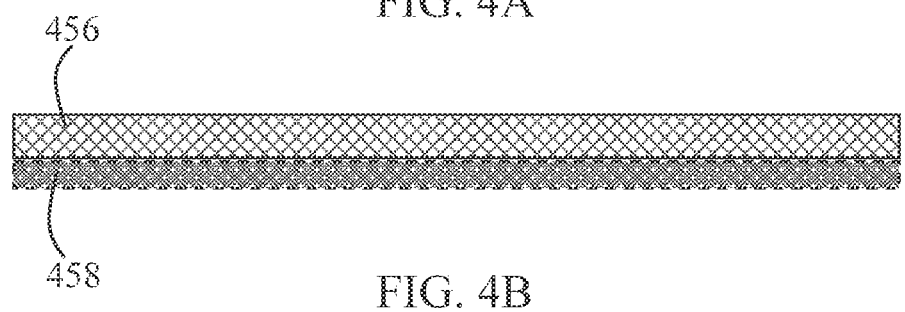

In optional block 304 (shown in dashed lines because of being optional), referring now to FIG. 4B, a marking film coating 458 is attached to a first side of the metal layer 456. Block 304 may be followed by block 306.

Figure 4C:
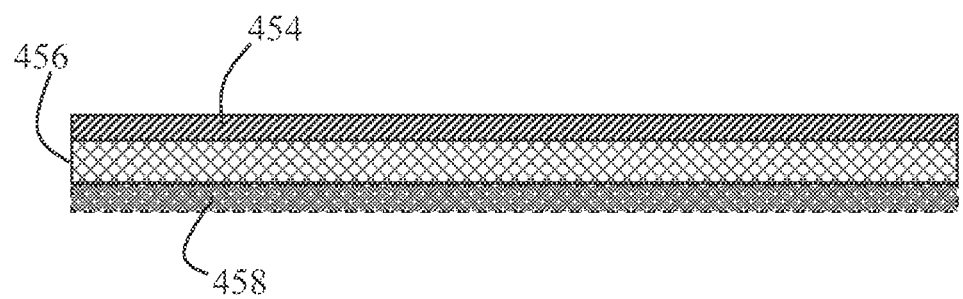

In block 306, referring now to FIG. 4C, film laminate 454 is attached to a second side of the metal layer opposite to the first side of the metal layer 456 so as to form the supporting structure 252 of FIG. 2I.

Block 118 may be followed by block 120.

Figure 2J:
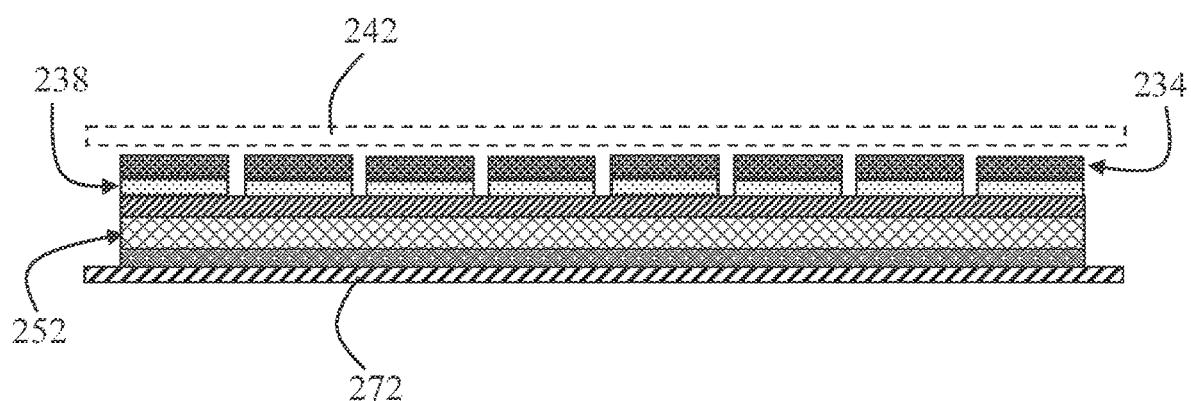

In block 120, referring now to FIG. 2J, a third tape 272 is attached to the supporting structure 252. In one example, the third tape 272 is directly attached to the marking film coating 258 of the supporting structure 252. In another example, the third tape 272 is directly attached to the metal layer 256 (without the marking film coating 258) of the supporting structure 252. Block 120 may be followed by block 122.

In block 122, still referring now to FIG. 2J, the second tape 242 (shown in dashed lines) is removed. The supporting structure 252 holds the separated devices on their positions to maintain the wafer shape. Block 122 may be followed by block 124.

Figure 2K:
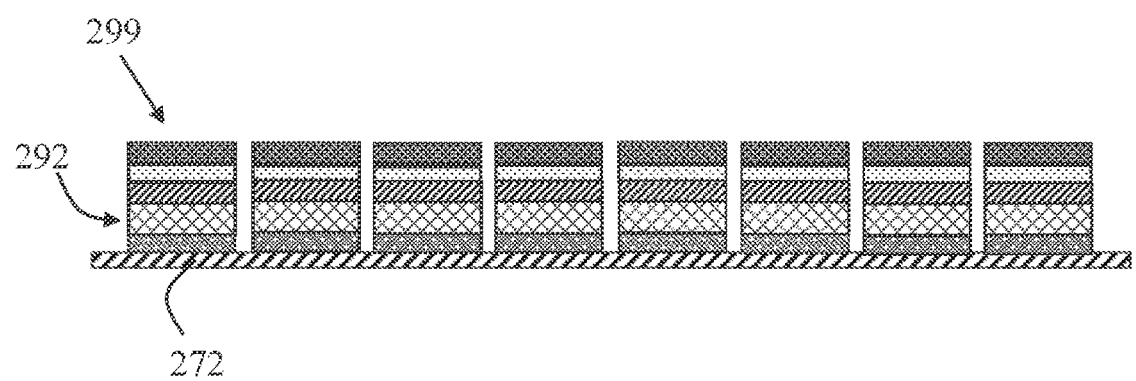

In block 124, referring now to FIG. 2K, a singulation process is applied. The singulation process aligned with spaces separating the diced device sections 234 and diced metallization sections 238 cuts through the supporting structure 252 forming a plurality of diced supporting structure sections 292. In one example, the singulation process cuts from the front side and stops on a top surface of the third tape 272. In another example, the singulation process cuts into the third tape 272 for a depth in a range from 5% to 15% of a thickness of the third tape 272. A plurality of semiconductor packages 299 are formed. Each of the plurality of semiconductor packages 299 may later be separated from the third tape 272.

Figure 7:
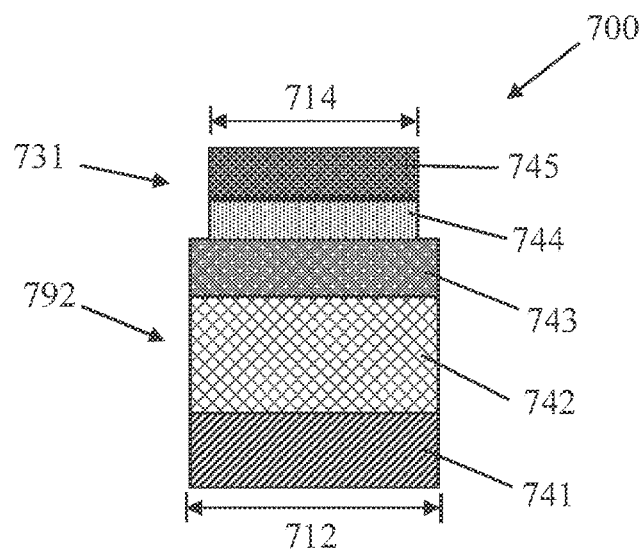
FIG. 7 shows a cross-sectional plot of a semiconductor package in examples of the present disclosure.

Referring now to FIG. 7, in examples of the present disclosure, a radius of a first saw conducting the dicing process is larger than a radius of a second saw conducting the singulation process so that a first width 712 of each of the diced supporting structure sections 792 is larger than a second width 714 of each of the plurality of diced device sections 731. Therefore, each of the plurality of diced device sections 731 is protected by reducing the chance of being touched because of the narrower second width 714. The semiconductor package 700 comprises a marking film coating layer 741 overlaying a thick metal layer 742 attached through a film laminate layer 743 to a backside metallization layer 744 on a back surface of a device semiconductor layer 745. As shown in FIG. 7, a side surface of the device backside metallization layer 744 is substantially coplanar with a corresponding side surface of device semiconductor layer 745 on all sides. A side surface of the thick metal layer 742 is substantially coplanar with a corresponding side surface side surface of the film laminate layer 743 and a corresponding side surface of the marking film coating layer 741 on all sides. Each edge of the device backside metallization layer 744 recess from corresponding edge of the thick metal layer 742 on all sides. The device semiconductor layer 745 may include one or more field effect transistors (FETs).

Figure 5:
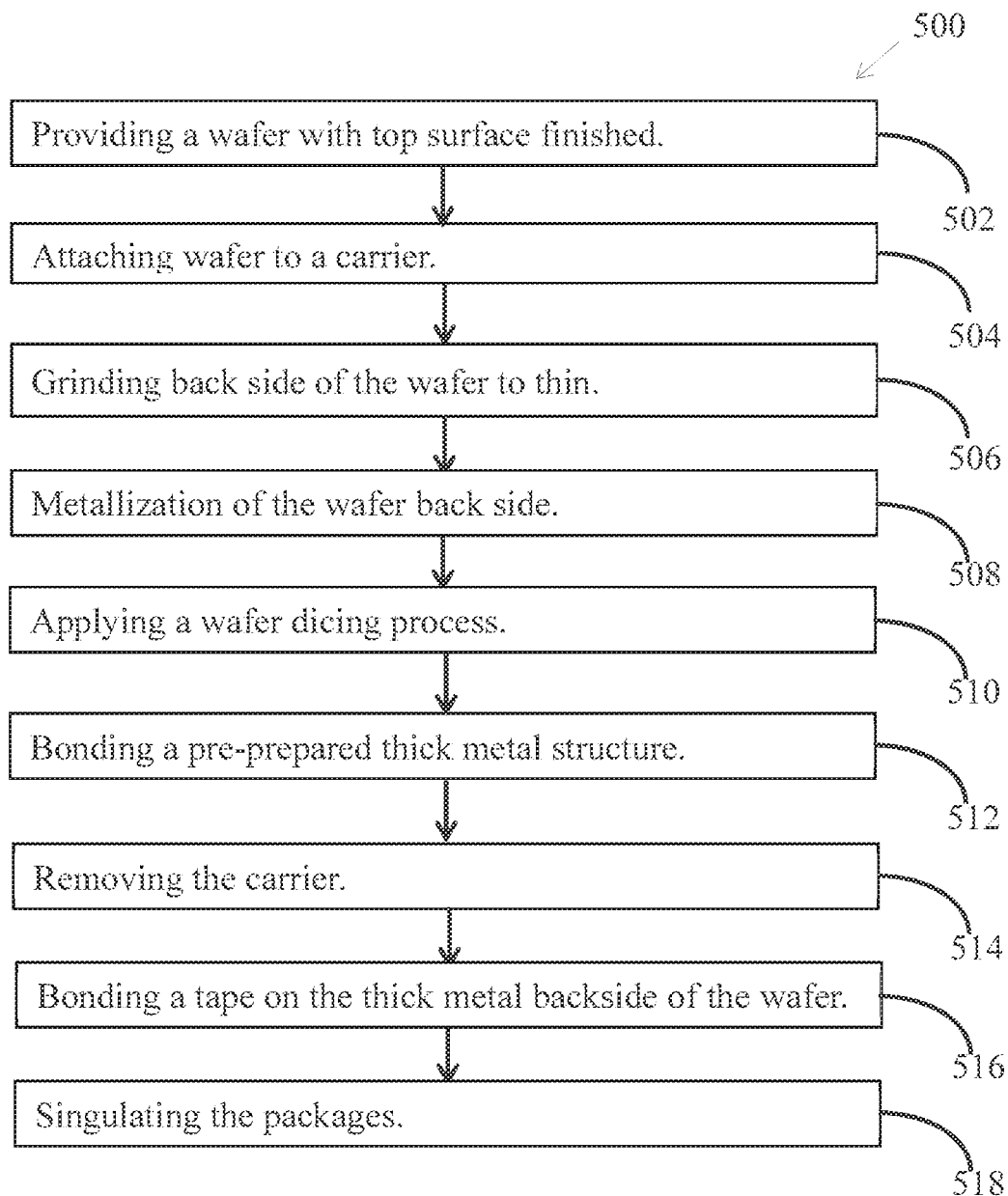
FIG. 5 is another flowchart of a process to develop a plurality of semiconductor packages in examples of the present disclosure.

FIG. 5 is a flowchart of a process 500 to develop a plurality of semiconductor packages in examples of the present disclosure. FIGS. 6A-6I show the cross sections of the corresponding steps. The process 500 may start from block 502.

Figure 6A:
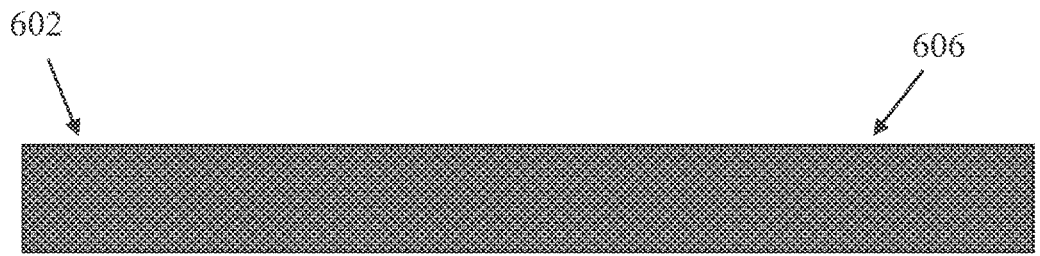
FIGS. 6A-6I show the cross sections of the corresponding steps of the process of FIG. 5 in examples of the present disclosure.

A In block 502, referring now to FIG. 6A, a wafer 602 is provided. In one example, a top surface of the wafer 602 is finished with plurality of semiconductor devices formed thereon. The wafer 602 comprises a front side 604 and a back side 606 opposite the front side 604. Each semiconductor device includes a plurality of metal electrodes [not shown, metal electrodes are conventional features described in 37 CFR 1.83(a)] disposed on the front side 204. In one example, the wafer 602 is a silicon wafer. The wafer 602 may be a 4-inch, 6-inch, 8-inch, 12-inch, or 18-inch diameter wafer. Block 502 may be followed by block 504.

Figure 6B:
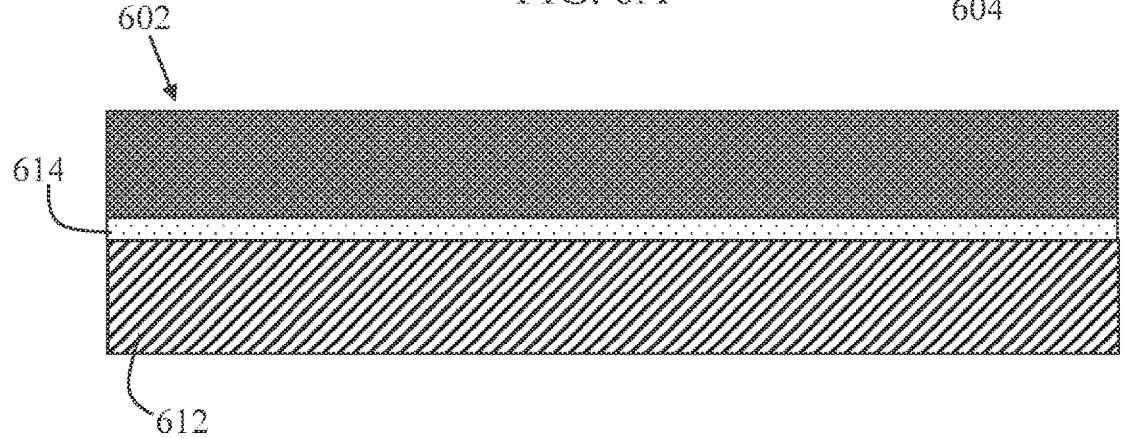

In block 504, referring now to FIG. 6B, a carrier wafer 612 is attached to the front side 604 of the wafer 602 through adhesive 614. In one example, the adhesive 614 is non-conductive adhesive. In another example, the adhesive 614 is conductive adhesive. Block 504 may be followed by block 506.

Figure 6C:
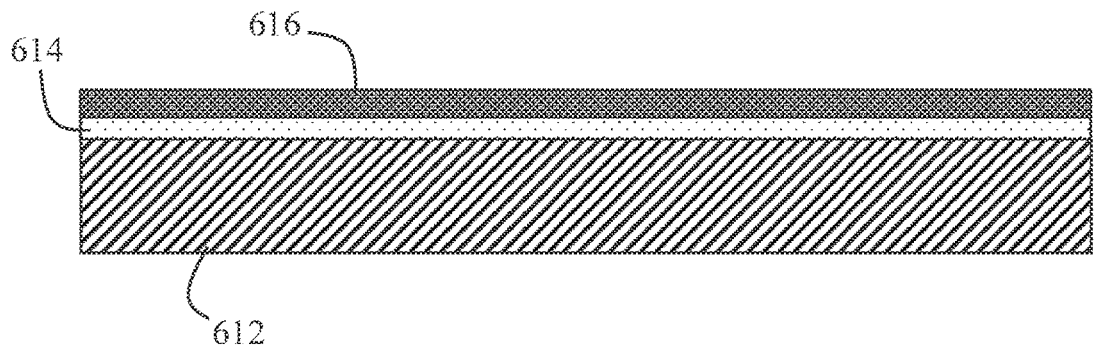

In block 506, referring now to FIG. 6C, a grinding process is applied to the back side 606 of the wafer 602 so as to form a thinned device layer 616. Block 506 may be followed by block 508.

Figure 6D:
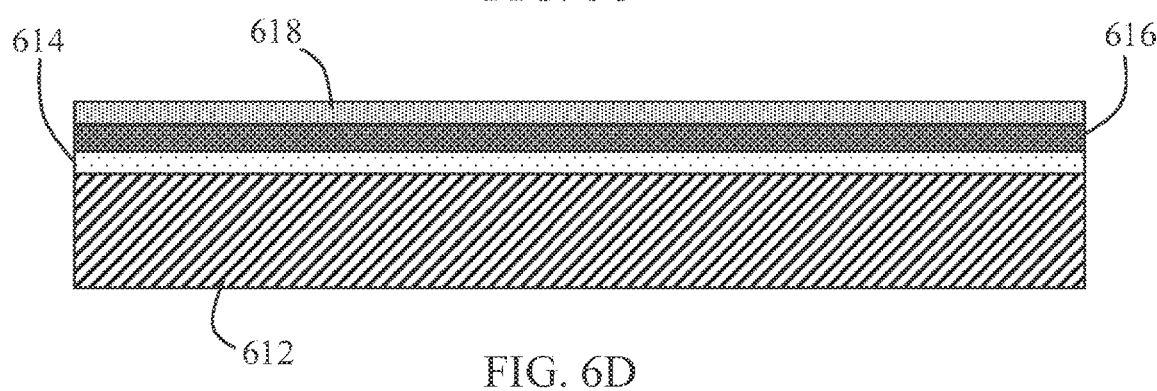

In block 508, referring now to FIG. 6D, a metallization layer 618 is formed. The metallization layer 618 is deposited to the back side of the wafer. In one example, the metallization layer 618 is directly attached to the thinned device layer 616. The metallization layer 618 is made of copper. Block 508 may be followed by block 510.

Figure 6E:
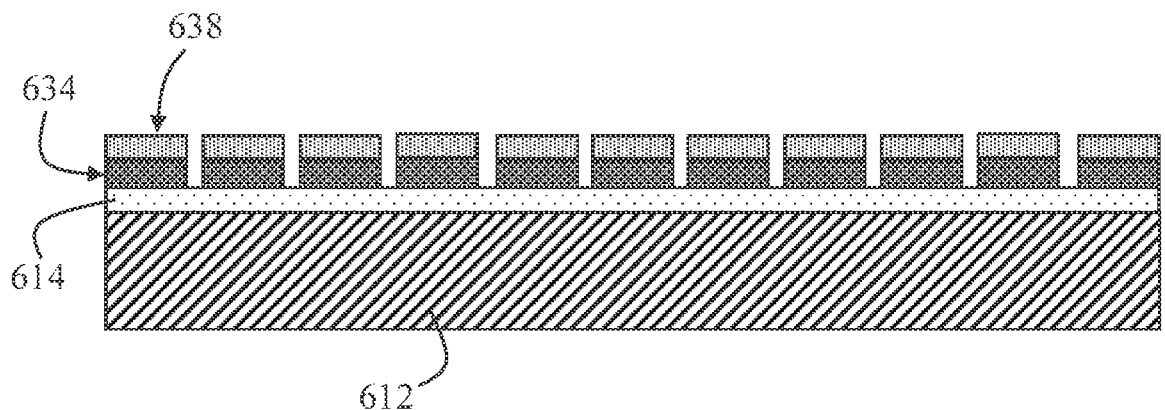

In block 510, referring now to FIG. 6E, a dicing process is applied. A plurality of diced device sections 634 and a plurality of diced metallization sections 638 are formed. In one example, a cut of the dicing process stops at a top surface of the adhesive 614. In another example, a cut of the dicing process cuts into the adhesive 614 with a cutting depth in a range from 5% to 15% of a thickness of the adhesive 614. The adhesive 614 holds the separated devices positions on the carrier wafer 612 to maintain the wafer shape. Block 510 may be followed by block 512.

Figure 6F:
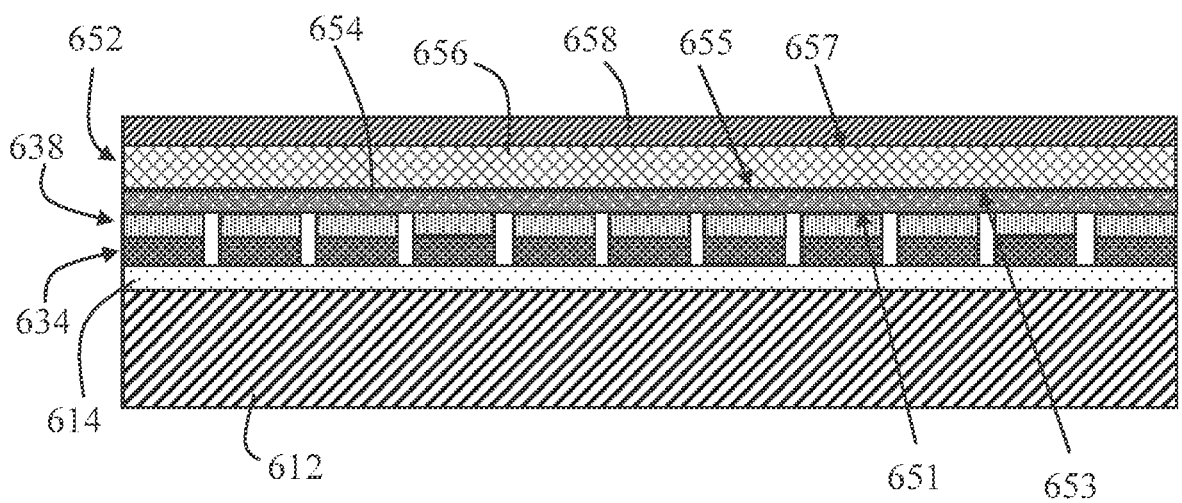

In block 512, referring now to FIG. 6F, a supporting structure 652 is attached to the plurality of diced metallization sections 638. In examples of the present disclosure, the supporting structure 652 is also referred to as a thick metal structure containing a thick metal layer of a pre-determined thickness. In one example, the supporting structure 652 consists of a film laminate 654 and a metal layer 656. In another example, the supporting structure 652 comprises a film laminate 654, a metal layer 656, and a marking film coating 658. The metal layer 656 comprises a first surface 657 and a second surface 655 opposite the first surface 657. The film laminate 654 comprises a first surface 653 and a second surface 651 opposite the first surface 653. The first surface 653 of the film laminate 654 is attached to the second surface 655 of the metal layer 656. The second surface 651 of the film laminate 654 is attached to the plurality of diced metallization sections 638. Block 512 may be followed by block 514.

Figure 6G:
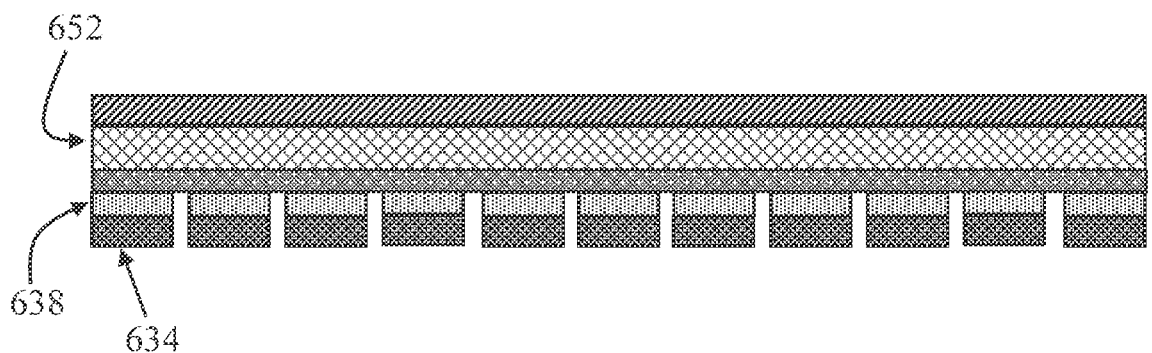

In block 514, referring now to FIG. 6G, the carrier wafer 612 and the adhesive 614 are removed. The supporting structure 652 holds the separated devices on their positions to maintain the wafer shape. Block 514 may be followed by block 516.

Figure 6H:
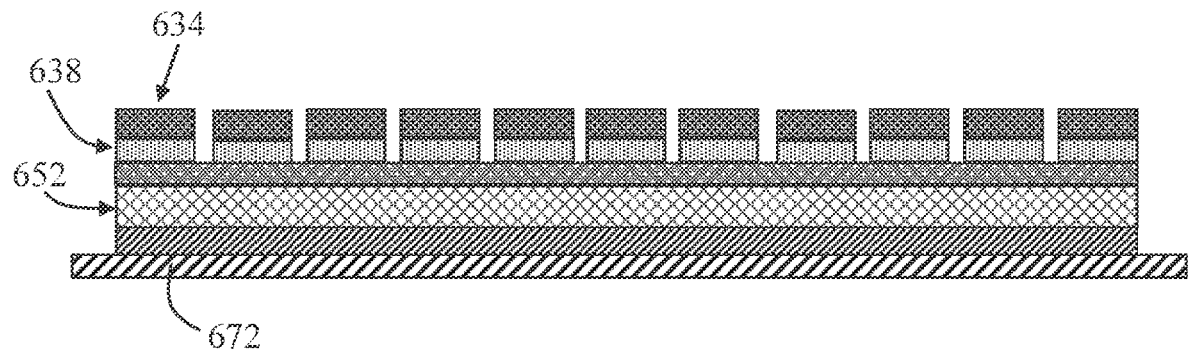

In block 516, referring now to FIG. 6H, a tape 672 is attached to the supporting structure 652. In one example, the tape 672 is directly attached to the marking film coating 658 of the supporting structure 652. In another example, the tape 672 is directly attached to the metal layer 656 (without the marking film coating 658) of the supporting structure 652. Block 516 may be followed by block 518.

Figure 6I:
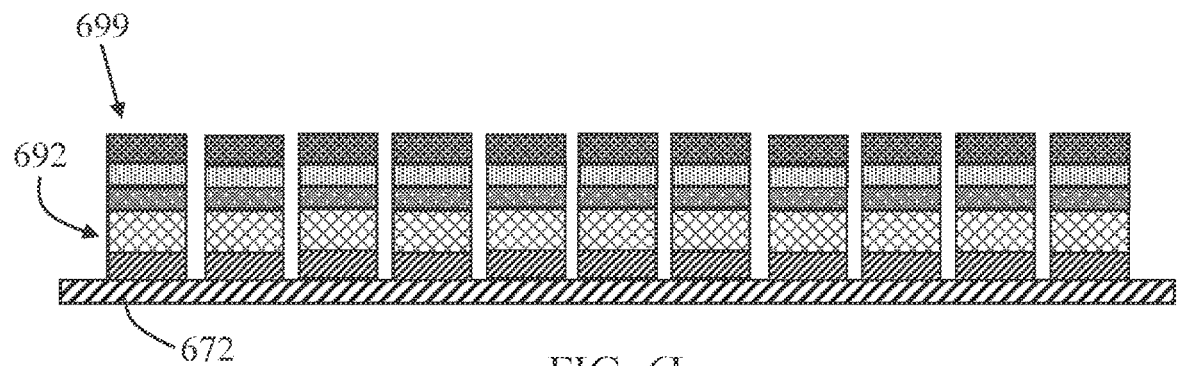

In block 518, referring now to FIG. 6I, a singulation process is applied. The singulation process aligned with spaces separating the diced device sections 634 and diced metallization sections 638 cuts through the supporting structure 652 forming a plurality of diced supporting structure sections 692. In one example, the singulation process stops on a top surface of the tape 672. In another example, the singulation process cuts into the tape 672 for a depth in a range from 5% to 15% of a thickness of the tape 672. A plurality of semiconductor packages 699 are formed. Each of the plurality of semiconductor packages 699 may later be separated from the third tape 672.

In examples of the present disclosure, a radius of a first saw conducting the dicing process is larger than a radius of a second saw conducting the singulation process so that a first width 712 of FIG. 7 of each of the diced supporting structure sections 792 is larger than a second width 714 of each of the plurality of diced device sections 731. An area of the thick metal layer 742 is larger than an area of the backside metallization layer 744 and extends beyond all edges of the device semiconductor layer 745.

Those of ordinary skill in the art may recognize that modifications of the embodiments disclosed herein are possible. For example, a number of the plurality of semiconductor packages made from one wafer may vary. Other modifications may occur to those of ordinary skill in this art, and all such modifications are deemed to fall within the purview of the present invention, as defined by the claims.

The invention claimed is:

1. A wafer level chip scale semiconductor package comprising:
  a device semiconductor layer comprising a plurality of metal electrodes disposed on a front surface of the device semiconductor;
  a backside metallization layer attached to a back surface of the device semiconductor layer;
  a metal layer attached through a film laminate layer to the backside metallization layer; and
  a marking film coating layer overlaying the metal layer;
  wherein each side surface of the backside metallization layer is coplanar with a corresponding side surface of the device semiconductor layer;
  wherein each side surface of the metal layer is coplanar with a corresponding side surface of the film laminate layer; and
  wherein a surface area of a back surface of the backside metallization layer is smaller than a surface area of a front surface of the metal layer.

2. The wafer level chip scale semiconductor package of claim 1,
  wherein each side surface of the metal layer is coplanar with a corresponding side surface of the marking film coating layer.

3. The wafer level chip scale semiconductor package of claim 2,
  wherein the surface area of the front surface of the metal layer extends beyond all edges of the device semiconductor layer.

4. A wafer level chip scale semiconductor package comprising:
  a device semiconductor layer comprising a plurality of metal electrodes disposed on a front surface of the device semiconductor;
  a backside metallization layer attached to a back surface of the device semiconductor layer; and
  a metal layer attached through a film laminate layer to the backside metallization layer;
  wherein each side surface of the backside metallization layer is coplanar with a corresponding side surface of the device semiconductor layer;
  wherein each side surface of the metal layer is coplanar with a corresponding side surface of the film laminate layer;
  wherein a surface area of a back surface of the backside metallization layer is smaller than a surface area of a front surface of the metal layer;
  wherein each side surface of the backside metallization layer is exposed; and
  wherein each side surface of the device semiconductor layer is exposed.

5. The wafer level chip scale semiconductor package of claim 4 further comprising:
  a marking film coating layer overlaying the metal layer.

6. The wafer level chip scale semiconductor package of claim 5,
  wherein each side surface of the metal layer is coplanar with a corresponding side surface of the marking film coating layer.

7. The wafer level chip scale semiconductor package of claim 6,
  wherein the surface area of the front surface of the metal layer extends beyond all edges of the device semiconductor layer.

* * * * *